United States Patent [19]

Tokunaga et al.

[11] 4,268,760
[45] May 19, 1981

[54] AMPLITUDE-LIMITER

[75] Inventors: Tadatsugu Tokunaga; Akira Fujii, both of Tokyo, Japan

[73] Assignee: Nippon Electric Co., Ltd., Tokyo, Japan

[21] Appl. No.: 17,991

[22] Filed: Mar. 7, 1979

[30] Foreign Application Priority Data

Mar. 7, 1978 [JP] Japan .............................. 53-29514[U]

[51] Int. Cl.³ .............................................. H03K 5/02
[52] U.S. Cl. ................................... 307/562; 307/494; 330/108
[58] Field of Search ............... 330/108, 110; 307/230, 307/237

[56] References Cited

U.S. PATENT DOCUMENTS

| 3,586,991 | 6/1971 | Vosteen | 330/110 X |
| 3,940,704 | 2/1976 | Bockett-Pugh | 307/237 X |

FOREIGN PATENT DOCUMENTS 513363  5/1976  U.S.S.R. .............................. 330/110

*Primary Examiner*—James B. Mullins
*Attorney, Agent, or Firm*—Sughrue, Rothwell, Mion, Zinn and Macpeak

[57] ABSTRACT

An amplitude limiting circuit is provided in which the input signal is fed to the non-inverting input terminal and the output is taken from the inverting input terminal of an operational amplifier having a feedback resistor connecting the inverting and output terminals of the amplifier. Either the input resistor, feedback resistor or operational amplifier supply voltages can be used to alter the upper and lower limit voltages of the circuit.

6 Claims, 9 Drawing Figures

FIG.1 PRIOR ART
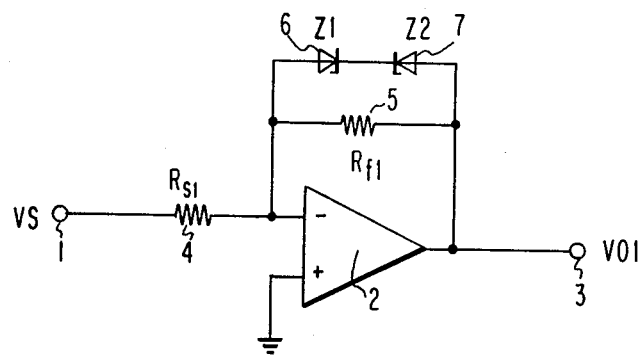
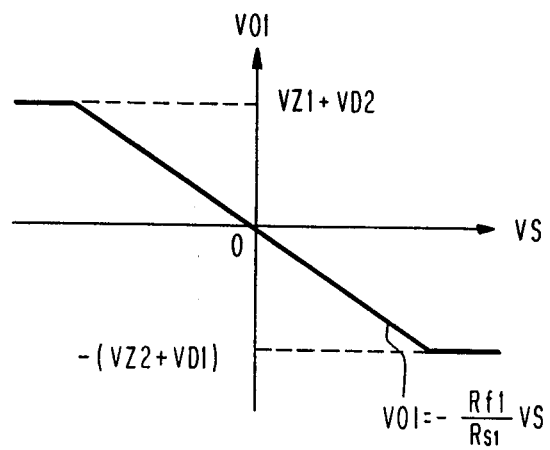
FIG.2 PRIOR ART

FIG. 7
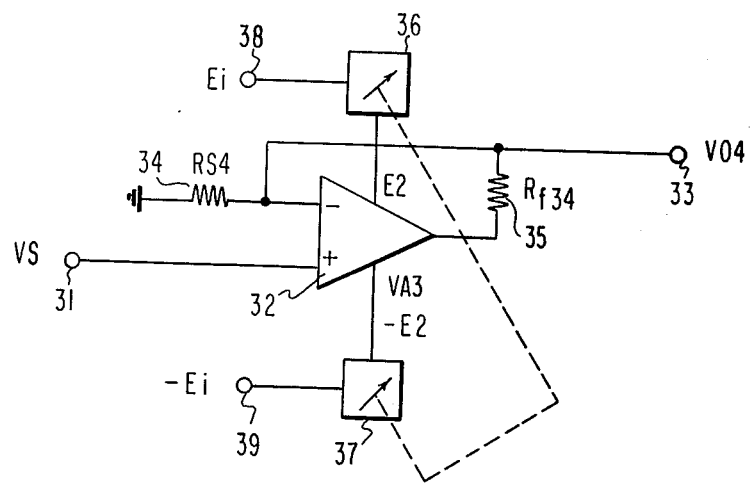
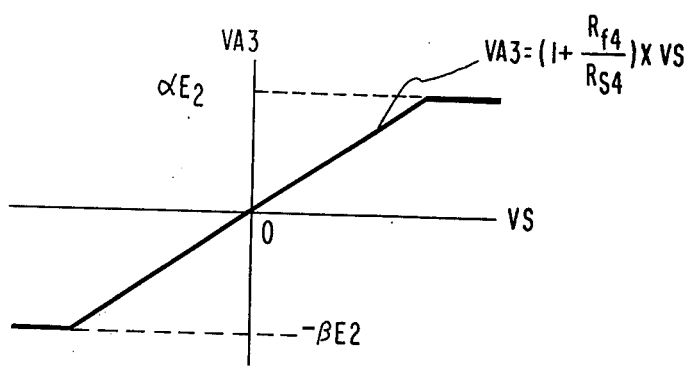
FIG. 8A
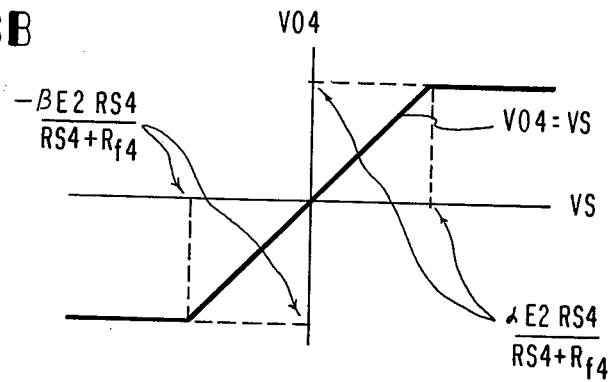
FIG. 8B

AMPLITUDE-LIMITER

BACKGROUND OF THE INVENTION

This invention relates to an amplitude-limiting circuit for preventing signals of amplitudes exceeding a prescribed value from being transmitted to any succeeding circuit.

A conventional circuit of this sort comprises: an operational amplifier having an inverted input terminal, a non-inverted input terminal connected to a ground point and an output terminal; a first resistor having one terminal receiving an input signal and the other terminal connected to the inverted input terminal; a second feedback resistor connected between the inverted input terminal and the output terminal; and a pair of zener diodes connected in series in mutually opposite polarities between the inverted input terminal and the output terminal. (See Jerald G. Graeme et. al., *OPERATIONAL AMPLIFIERS;* Design and Application, pp. 244-245, McGraw-Hill Book Company, 1971). In such circuit construction, the limited amplitude is usually varied by altering the resistance of the two resistors.

However, such conventional amplitude limiting circuits suffer from the following disadvantage. This construction, in which the input signal is fed to the amplifier through the variable first resistor and further is connected to the output signal through the variable second feedback resistor invites changes in the input-output level diagram of the amplitude-limiting circuit at the normal level. A change in the level diagram of the amplitude limiter necessitates an extremely complex adjustment of the level diagrams of all the relevant components of the transmission system.

SUMMARY OF THE INVENTION

It is an object of the present invention to provide an amplitude-limiting circuit free from this advantage.

In accordance with this invention an amplitude-limiting circuit is provided comprising an operational amplifier having an inverted input terminal, a non-inverted input terminal and a voltage input means connected to sources of positive and negative operating voltages; a first resistor having one terminal grounded and the other connected to the inverted input terminal; a feedback means for feeding back the output of the operational amplifier to the inverted input terminal; a first means for feeding an input signal to the non-inverted input terminal, and a second means for deriving an output signal from the inverted input terminal.

BRIEF DESCRIPTION OF THE DRAWINGS

The present invention will be described in detail below with reference to the accompanying drawings, in which:

FIG. 1 is a diagram of a conventional amplitude-limiting circuit;

FIG. 2 is the input-output level diagram of the circuit illustrated in FIG. 1;

FIG. 7 is a circuit diagram of a third embodiment of this invention, and

FIGS. 8A and 8B are the input-output level diagrams of the operational amplifier and the circuit, respectively, of FIG. 7.

Figure 3:
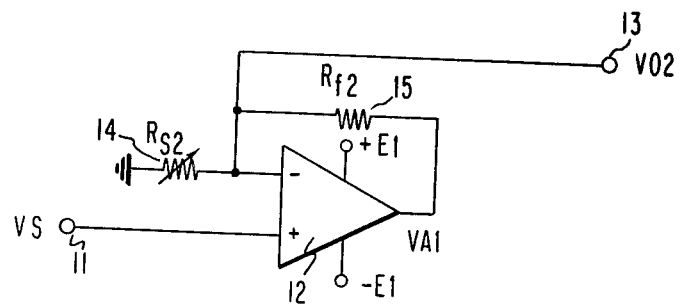
FIG. 3 is a circuit diagram of a first embodiment of this invention.

In the circuit illustrated in FIG. 1, two zener diodes 6 and 7 are connected in series, in mutually opposite directions, and in parallel with the feedback resistor 5 (having a resistance of $Rf_1$) of an operational amplifier 2. With the zener voltage and the forward voltage of the zener diode 6 represented by $V_{Z1}$ and $V_{D1}$, respectively, and the zener voltage and the forward voltage of the zener diode 7 represented by $V_{Z2}$ and $V_{D2}$, respectively, every voltage component of the output voltage $V_{01}$, except that between $(V_{Z1}+V_{D2})$ and $-(V_{Z2}+V_{D1})$, is fed back through the zener diodes 6 and 7. Therefore, the range of the output voltage $V_{01}$ corresponding to an input voltage $V_S$ will be:

$$\text{If } -(V_{Z2} + V_{D1}) < V_S \cdot (-\frac{R_{f1}}{R_{S1}}) < V_{Z1} + V_{D2}, \qquad (1)$$

$$V_{01} = -(\frac{R_{f1}}{R_{S1}}) \cdot V_S$$

$$\text{If } V_S \cdot (-\frac{R_{f1}}{R_{S1}}) \geq V_{Z1} + V_{D2}, \qquad (2)$$

$$V_{01} = V_{Z1} + V_{D2}$$

$$\text{If } V_S \cdot (-\frac{R_{f1}}{R_{S1}}) \leq -(V_{Z2} + V_{D1}), \qquad (3)$$

$$V_{01} = -(V_{Z2} + V_{D1})$$

This characteristic is illustrated in FIG. 2.

The limit on amplitude in this amplitude-limiting circuit illustrated in FIG. 1 can be varied only by replacing the zener diodes 6 and 7 with others to alter the absolute value of the limit or by changing the gain of the amplifier 2 to alter the limit relative to the absolute limit ($V_{Z1}+V_{D2}$ or $V_{Z2}+V_{D1}$ in this instance). Since replacement or switching of parts would result in inflexibility, the limit is usually varied in a relative manner by using a variable resistor as resistor 4 or 5 and thereby altering the gain of the amplifier 2. As is obvious from the characteristic illustrated in FIG. 2, a variation in the resistance of the resistor 4 or 5 accompanying a relative change in limit would invite a variation in the input-output level diagram at the normal level (in this case, $-(V_{Z2}+V_{D1})<V_S(-R_{f1}/R_{S1}<V_{Z1}+V_{D2})$ and result in the aforementioned disadvantage.

DETAILED DESCRIPTION OF THE EMBODIMENTS

Figure 4A:
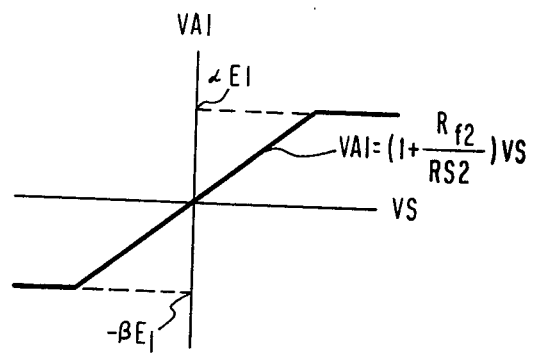
FIGS. 4A and 4B are the input-output level diagrams of the operational amplifier and the circuit, respectively, of FIG. 3.

In FIG. 3, the output voltage $V_{A1}$ of the operational amplifier (differential amplifier) 12, when the amplifier is not saturated, is $$V_{A1} = (1 + \frac{R_{f2}}{R_{S2}})V_S$$

where $R_{S2}$ and $R_{f2}$ are the resistances of the resistors 14 and 15, respectively. When the input voltage $V_S$ rises very high to saturate the amplifier, $$V_{A1} = \alpha E_1 \text{ or } -\beta E_1$$

where $\pm E_1$ are the positive and negative source voltages, respectively, impressed on the amplifier, and $\alpha E_1$ and $-\beta E_1$ are the saturating voltages of the amplifier 12 respectively corresponding to these impressed voltages. This characteristic is illustrated in FIG. 4A.

In the circuit construction of FIG. 3, the operational amplifier 12 includes a pair of transistors (not shown) connected to the inverted input terminal (−) and the non-inverted input terminal (+), respectively. Accordingly, when the amplifier 12 is not saturated, both of the transistors are turned on. Therefore, the output voltage $V_{02}$ is identical with the input voltage $V_S$. This means that an "imaginary-short" circuit is equivalently provided between the inverted and non-inverted input terminals. On the other hand, when the amplifier 12 becomes saturated, only one of the transistors is turned on. Accordingly, the imaginary shorted state can not be maintained any longer. Therefore, the output voltage $V_{02}$ becomes constant instead of being proportional to the input voltage $V_S$. Thus, the limit on the output voltage will be $$V_{02} = \frac{\alpha E_1 R_{S2}}{R_{S2} + R_{f2}} \text{ or } V_{02} = \frac{-\beta E_1 R_{S2}}{R_{S2} + R_{f2}}$$

Figure 4B:
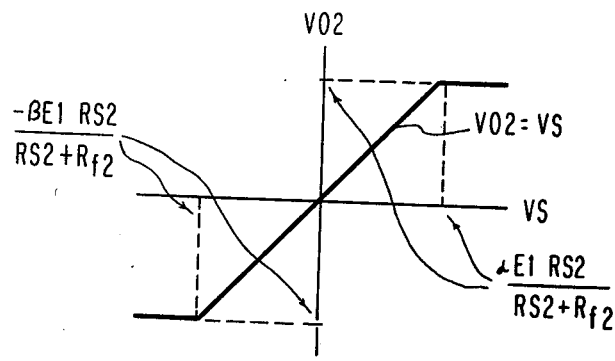

This characteristic is illustrated in FIG. 4B. The voltage limits can be readily varied by altering the resistance $R_{S2}$ or $R_{f2}$; and the variation in voltage limits would invite no variation in the input-output level diagram at the normal range of $$\frac{-\beta E_1 R_{S2}}{R_{S2} + R_{f2}} < V_S < \frac{\alpha E_1 R_{S2}}{R_{S2} + R_{f2}}.$$

Figure 5:
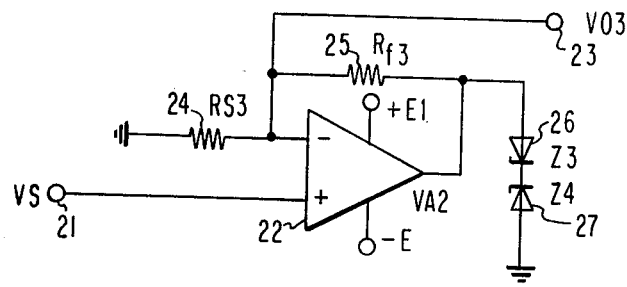
FIG. 5 is a circuit diagram of a second embodiment of this invention.

In FIG. 5, the zener diode 26 is supposed to have a zener voltage of $V_{Z3}$ and a forward voltage of $V_{D3}$, and the zener diode 27 a zener voltage of $V_{Z4}$ and a forward voltage of $V_{D4}$. The output voltage $V_{A2}$ of the operational amplifier 22, when it is within the range between $(V_{Z3} + V_{D4})$ and $-(V_{Z4} + V_{D3})$, is proportional to the input voltage $V_S$, $$V_{A2} = (1 + \frac{R_{f3}}{R_{S3}})V_S$$

where $R_{S3}$ and $R_{f3}$ are the resistances of the resistors 24 and 25, respectively. However, when the input voltage $V_S$ rises very high accompanied by a corresponding rise in the voltage $V_{A2}$, all the components of the voltage $V_{A2}$ outside the range from $-(V_{Z3} + V_{D4})$ to $(V_{Z4} + V_{D3})$ will be grounded through the zener diode 26 and 27. Thus If $V_S \geq \frac{R_{S3}}{R_{S3} + R_{f3}} (V_{Z4} + V_{D3}), V_{A2} = V_{Z4} + V_{D3}$    (1)

If $V_S \leq \frac{-R_{S3}}{R_{S3} + R_{f3}} (V_{Z3} + V_{D4}), V_{A2} = -(V_{Z3} + V_{D4})$    (2)

Figure 6A:
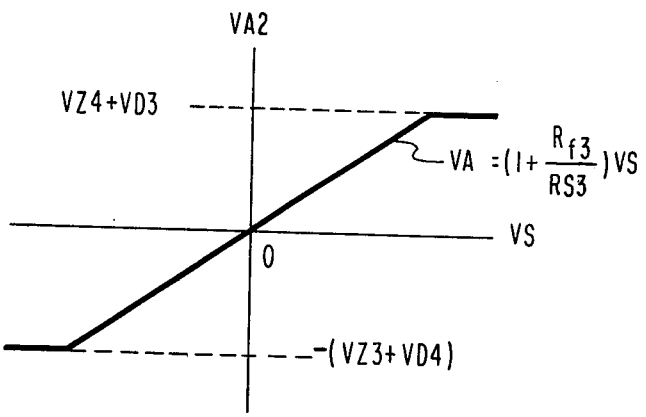
FIGS. 6A and 6B are the input-output level diagrams of the operational amplifier and the circuit, respectively, of FIG. 5.

This characteristic is illustrated in FIG. 6A.

Like in the circuit construction illustrated in FIG. 3, the imaginary short circuit state is provided between the inverted input terminal (−) and the non-inverted input terminal (+) of the amplifier 22. Accordingly, when $$\frac{R_{S3}}{R_{S3} + R_{f3}} (V_{Z4} + V_{D3}) > V_S > \frac{-R_{S3}}{R_{S3} + R_{f3}} (V_{Z3} + V_{D4}),$$

the output voltage $V_{03}$ is identical with the input voltage $V_S$. However, when $V_S$ is either equal to or greater than $$\frac{R_{S3}}{R_{S3} + R_{f3}} (V_{Z4} + V_{D3})$$

or is either equal to or smaller than $$\frac{-R_{S3}}{R_{S3} + R_{f3}} (V_{Z3} + V_{D4}),$$

the output voltage $V_{03}$ (i.e. the limit) will be either.

$$V_{03} = \frac{R_{S3}}{R_{S3} + R_{f3}} (V_{Z4} + V_{D3}) \text{ or}$$

$$V_{03} = \frac{-R_{S3}}{R_{S3} + R_{f3}} (V_{Z3} + V_{D4}).$$

Figure 6B:
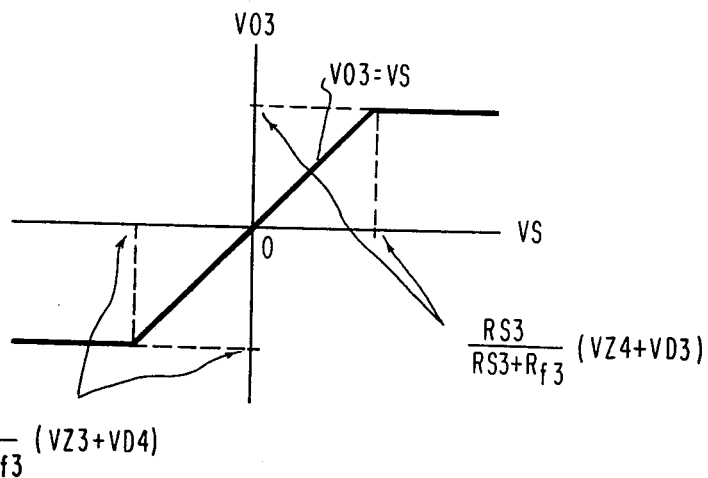

This characteristic is illustrated in FIG. 6B. The upper and lower limits can be readily varied by altering the resistance $R_{S3}$ or $R_{f3}$; and this variation in voltage limits would invite no variation in input-output level diagram at the normal level $$(\frac{-R_{S3}(V_{Z3} + V_{D4})}{R_{S3} + R_{f3}} < V_S < \frac{R_{S3}(V_{Z4} + V_{D3})}{R_{S3} + R_{f3}}).$$

In FIG. 7, the variable voltage supplying circuits 36 and 37 are so constructed that, when the output voltage of one of them is varied, that of the other will also be varied, either interlocked with or following the first, at the same rate. The source voltage $E_i$ fed to the terminal 38 is altered in level by the voltage control circuit 36 to become $E_2$ which is the positive voltage on the operational amplifier 32. On the other hand, the source voltage $-E_i$ fed to the terminal 39 is altered in level by the voltage control circuit 37 to become $-E_2$ which is the negative voltage on the amplifier 32. The output voltage $V_{A3}$ of the amplifier 32, when the amplifier 32 is not saturated, is $$V_{A3} = (1 + \frac{R_{f4}}{R_{S4}})V_S$$

where $R_{S4}$ and $R_{f4}$ are the resistance of the resistors 34 and 35, respectively. When the input voltage $V_S$ rises very high, the amplifier 32 becomes saturated. This saturated state obviously is a function of the voltages supplied to the amplifier 32. With the saturating voltages of the amplifier 32 corresponding to the voltages $\pm E_2$ being respectively represented by $\alpha E_2$ and $-\beta E_2$, the relationship between the input voltage $V_S$ and the output voltage $V_{A3}$ of the amplifier 32 will have a characteristic like what is illustrated in FIG. 8A. The output voltage $V_{04}$, when the amplifier is saturated, determines the limit on the amplitude and has a value of either $$V_{04} = \frac{\alpha E_2 R_{S4}}{R_{S4} + R_{f4}} \text{ or } V_{04} = \frac{-\beta E_2 R_{S4}}{R_{S4} + R_{f4}}$$

This amplitude-limiting characteristic is illustrated in FIG. 8B. The limit amplitude can be readily varied by controlling the circuits 36 and 37 to alter the voltages on the amplifier 32. This variation in the voltage limits would invite no variation in input-output level diagram at the normal level $$\left( \frac{-\beta E_2 R_{S4}}{R_{S4} + R_{f4}} < V_S < \frac{\alpha E_2 R_{S4}}{R_{S4} + R_{f4}} \right).$$

As is evident from the description above, the amplitude-limiting circuit in accordance with the present invention can have its voltage limits varied without affecting the input-output level diagram at the normal level of input voltages.

What is claimed is:

1. An amplitude-limiting circuit comprising: an operational amplifier having an inverted input terminal, a non-inverted input terminal and a voltage input means connected to sources of positive and negative operating voltages; a first resistor having one terminal grounded and the other terminal connected to said inverted input terminal; a second feedback resistor for feeding back the output of said operational amplifier to said inverted input terminal; a first means for feeding an input signal to said non-inverted input terminal, and a second means for deriving an output signal from said inverted input terminal.

2. An amplitude-limiting circuit according to claim 1, wherein at least one of said first resistor and feedback resistor comprises a variable resistor.

3. An amplitude-limiting circuit according to claim 1, wherein said feedback resistor is connected between the output of said operational amplifier and said inverted input terminal, said amplitude-limiting circuit further comprising a pair of zener diodes connected in series in mutually opposite polarities between the output of said operational amplifier and ground.

4. An amplitude-limiting circuit according to claim 1, wherein said voltage input means comprises a variable voltage input means.

5. An amplitude-limiting circuit according to claim 3 or 4, wherein at least one of said first and second resistors comprises a variable resistor.

6. An amplitude-limiting circuit as defined in claim 1, wherein said output signal is obtained by voltage dividing the voltage at the output of said operational amplifier through a voltage divider including said first and second resistors.

* * * * *